(12) United States Patent
Huang et al.

(10) Patent No.: US 10,276,542 B2
(45) Date of Patent: Apr. 30, 2019

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Li-Hsien Huang, Hsinchu County (TW); An-Jhih Su, Taoyuan (TW); Hsien-Wei Chen, Hsinchu (TW); Hua-Wei Tseng, New Taipei (TW); Jo-Mei Wang, New Taipei (TW); Tien-Chung Yang, Hsinchu (TW); Kuan-Chung Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/215,605

(22) Filed: Jul. 21, 2016

(65) Prior Publication Data

US 2018/0026010 A1 Jan. 25, 2018

(51) Int. Cl.
*H01L 25/065* (2006.01)
*H01L 23/552* (2006.01)
(Continued)

(52) U.S. Cl.
CPC ........ *H01L 25/0657* (2013.01); *H01L 21/485* (2013.01); *H01L 21/486* (2013.01); *H01L 21/4853* (2013.01); *H01L 21/565* (2013.01); *H01L 23/3114* (2013.01); *H01L 23/5382* (2013.01); *H01L 23/5384* (2013.01); *H01L 23/5386* (2013.01); *H01L 23/5389* (2013.01); *H01L 23/552* (2013.01); *H01L 25/50* (2013.01); *H01L 2225/06513* (2013.01); *H01L 2225/06537* (2013.01); *H01L 2225/06548* (2013.01);
(Continued)

(58) Field of Classification Search
CPC ......... H01L 2225/06541; H01L 23/481; H01L 2924/3025; H01L 2225/06537; H01L 23/552; H01L 21/486; H01L 25/0657
See application file for complete search history.

(56) References Cited

U.S. PATENT DOCUMENTS 8,361,842 B2  1/2013  Yu et al.
8,680,647 B2  3/2014  Yu et al.
(Continued)

*Primary Examiner* — Frederick B Hargrove
(74) *Attorney, Agent, or Firm* — JCIPRNET

(57) ABSTRACT

A package structure has first and second dies, a molding compound, a first redistribution layer, at least one first through interlayer via (TIV), second through interlayer vias (TIVs), an electromagnetic interference shielding layer and conductive elements. The first die is molded in the molding compound. The second die is disposed on the molding compound. The first redistribution layer is located between the conductive elements and the molding compound and electrically connected to the first and second dies. The molding compound is located between the second die and the first redistribution layer. The first and second TIVs are molded in the molding compound and electrically connected to the first redistribution layer. The second TIVs are located between the first die and the first TIV. The electromagnetic interference shielding layer is in contact with the first TIV. The conductive elements are connected to the first redistribution layer.

20 Claims, 11 Drawing Sheets

(51) Int. Cl.
*H01L 23/538* (2006.01)
*H01L 23/31* (2006.01)
*H01L 25/00* (2006.01)
*H01L 21/48* (2006.01)
*H01L 21/56* (2006.01)

(52) U.S. Cl.
CPC ............ *H01L 2225/06555* (2013.01); *H01L 2225/06582* (2013.01); *H01L 2225/06593* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,318,442 B1 * | 4/2016 | Chen | H01L 21/486 |
| 2011/0291288 A1 | 12/2011 | Wu et al. | |
| 2011/0304015 A1 * | 12/2011 | Kim | H01L 23/552 257/532 |
| 2012/0086109 A1 * | 4/2012 | Kim | H01L 21/561 257/659 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0182402 A1 * | 7/2013 | Chen | H01L 23/49827 361/807 |
| 2013/0264684 A1 | 10/2013 | Yu et al. | |
| 2013/0307140 A1 | 11/2013 | Huang et al. | |
| 2014/0110856 A1 * | 4/2014 | Lin | H01L 24/19 257/774 |
| 2014/0203429 A1 | 7/2014 | Yu et al. | |
| 2014/0225222 A1 | 8/2014 | Yu et al. | |
| 2014/0252646 A1 * | 9/2014 | Hung | H01L 23/481 257/774 |
| 2014/0264930 A1 | 9/2014 | Yu et al. | |

\* cited by examiner

US 10,276,542 B2

PACKAGE STRUCTURE AND MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
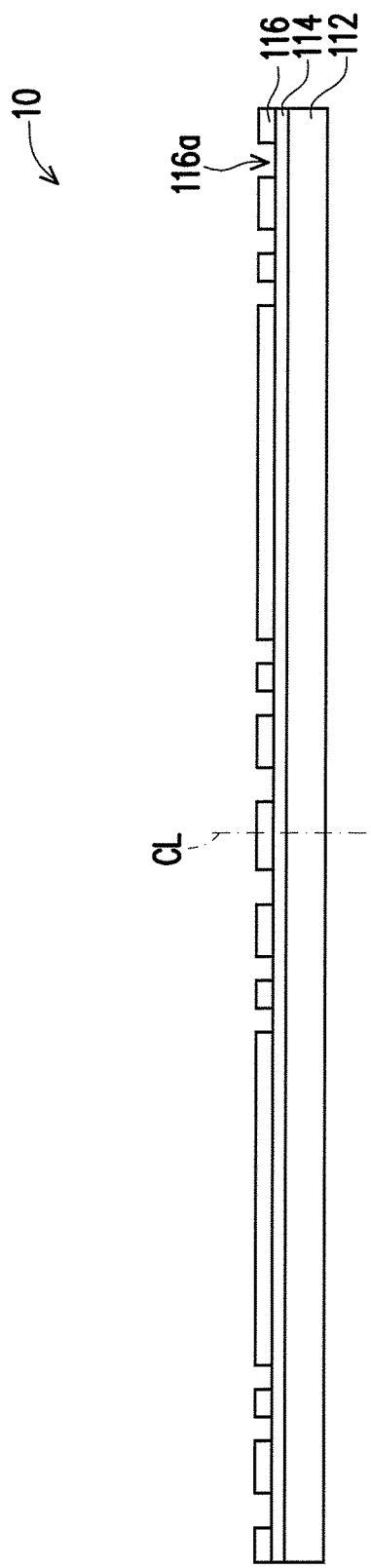
FIG. 1 to FIG. 12 are schematic cross sectional views of various stages in a manufacturing method of a package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

FIG. 1 to FIG. 12 are schematic cross sectional views of various stages in a manufacturing method of a package structure according to some exemplary embodiments of the present disclosure. In exemplary embodiments, the manufacturing method is part of a wafer level packaging process. In some embodiments, two dies are shown to represent plural dies of the wafer, and a semiconductor package 10 is shown to represent a package structure obtained following the manufacturing method. In some embodiments, as shown in FIG. 1 to FIG. 12, the dotted line represents a cutting line CL of two semiconductor package 10.

Referring to FIG. 1, in some embodiments, a carrier 112 is provided, and the carrier 112 may be a glass carrier or any suitable carrier for the manufacturing method of the package structure. In some embodiments, the carrier 112 is coated with a debond layer 114. The material of the debond layer 114 may be any material suitable for debonding the carrier 112 from the above layers disposed thereon. Next, a patterned dielectric layer 116 is formed on the carrier 112 by forming a dielectric material layer (not shown) over the carrier 112 and patterning the dielectric material layer so as to form the patterned dielectric layer 116 having a plurality of openings 116a exposing the debond layer 114. The patterned dielectric layer 116 may be formed by a suitable fabrication technique such as spin-coating, lamination, deposition or the like. In some embodiments, the patterned dielectric layer 116 is a polymer layer; the polymer layer may include polyimide, polybenzoxazole (PBO), benzocyclobutene (BCB), Ajinomoto Buildup Film (ABF), Solder Resist film (SR), or the like.

Figure 2:
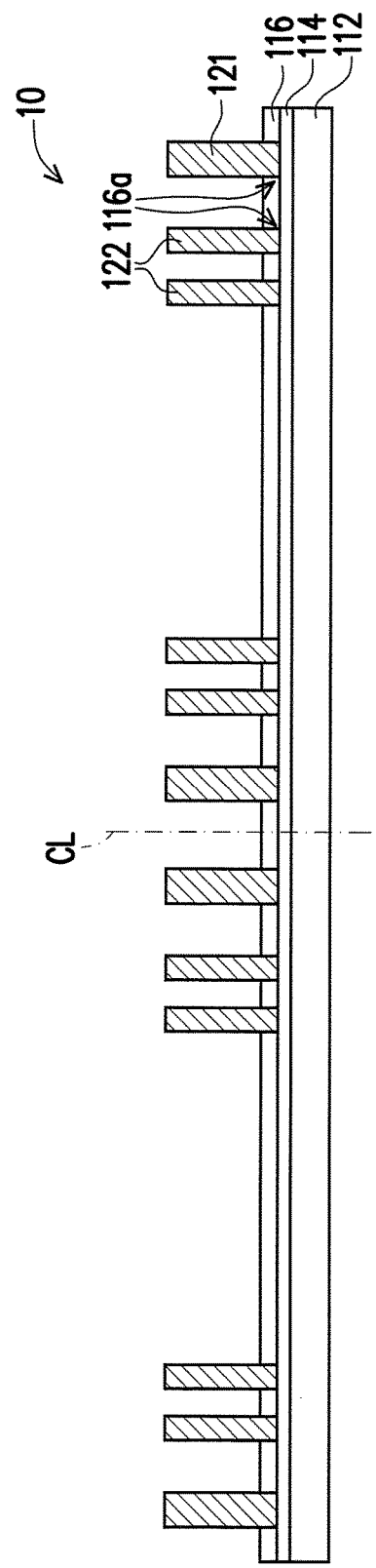

Referring to FIG. 2, in some embodiments, one or more first through interlayer vias (TIVs) 121 are formed on the carrier 112, and the first TIVs 121 are in contact with the debond layer 114 exposed by the openings 116a. In some embodiments, the first TIVs 121 are through integrated fan-out (InFO) vias. In certain embodiments, in the step of forming the first TIVs 121, one or more second through interlayer vias (TIVs) 122 are simultaneously formed on the carrier 112, and the second TIVs 122 are in contact with the debond layer 114 exposed by the openings 116a. In some embodiments, the second TIVs 122 are through integrated fan-out (InFO) vias. In certain embodiments, a portion of the first TIVs 121 and a portion of the second TIVs 122 are correspondingly located in the openings 116a of the patterned dielectric layer 116. In certain embodiments, the second TIVs 122 are located between the first die 130 and the first TIVs 121, and the first TIVs 121 are arranged along but not one the cutting line CL and between the cutting line CL and the second TIVs 122. In some embodiments, the first TIVs 121 and the second TIVs 122 are formed by photolithography, plating, photoresist stripping processes or any other suitable method. In one embodiment, the first TIVs 121 and the second TIVs 122 may be formed by forming a mask pattern (not shown) covering the patterned dielectric layer with openings exposing the debond layer 114 not covering by the patterned dielectric layer 116, forming a metallic material filling the openings to form the first TIVs 121 and the second TIVs 122 by electroplating or deposition and then removing the mask pattern. However, the disclosure is not limited thereto. In one embodiment, the second TIVs 122 may be formed following by the formation of the first TIVs 121 or prior to the formation of the first TIVs 121; the materials of the first TIVs 121 and the second TIVs 122 may be the same or different, and may include a metal material such as copper or copper alloys, or the like.

Figure 3:
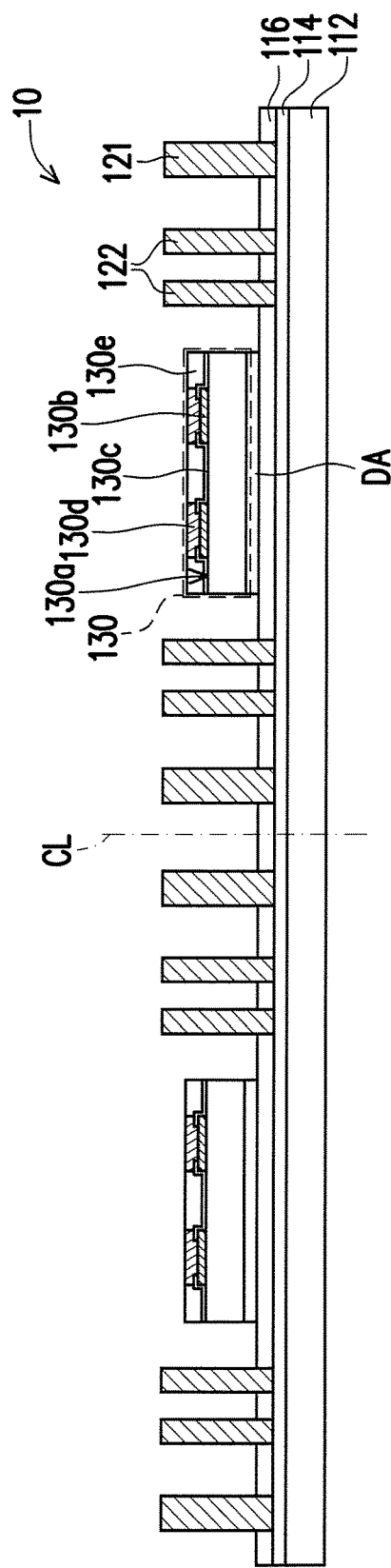

Referring to FIG. 3, in some embodiments, at least one first die 130 is provided; the first die 130 is disposed on the patterned dielectric layer 116 and over the carrier 112. In certain embodiments, the first die 130 is attached to the patterned dielectric layer 116 through a die attach film DA provided between the first die 130 and the patterned dielectric layer 116 for better adhering the first die 130 to the patterned dielectric layer 116. That is, in FIG. 3, a back surface of the first die 130 is stably adhered to the patterned dielectric layer 116. In some embodiments, the first die 130 includes an active surface 130a, a plurality of pads 130b distributed on the active surface 130a, a passivation layer 130c covering the active surface 130a and a portion of the pad 130b, a plurality of conductive pillars 130d, and a protection layer 130e. The pads 130b are partially exposed by the passivation layer 130c, the conductive pillars 130d are disposed on and electrically connected to the pads 130b, and the protection layer 130e covers the passivation layer 130c and exposes the conductive pillars 130d. The conductive pillars 130d are copper pillars, copper alloy pillar or other suitable metal pillars, for example. In some embodiments, the protection layer 130e may be a polybenzoxazole (PBO) layer, a polyimide (PI) layer or other suitable polymers. In some alternative embodiments, the protection layer 130e may be made of inorganic materials, such as silicon oxide, silicon nitride, silicon oxynitride, or any suitable dielectric material. In some embodiments, the first die 130 may be selected from application-specific integrated circuit (ASIC) chips, analog chips (for example, wireless and radio frequency chips, e.g., 2.4 GHz radio frequency chip, 5 GHz radio frequency chip, a combined 2.4 GHz/5 GHz radio frequency chip, 60 GHz radio frequency chip), digital chips (for example, 60 GHz baseband chip), integrated passive devices (IPDs), voltage regulator chips, sensor chips, memory chips, or the like.

Figure 4:
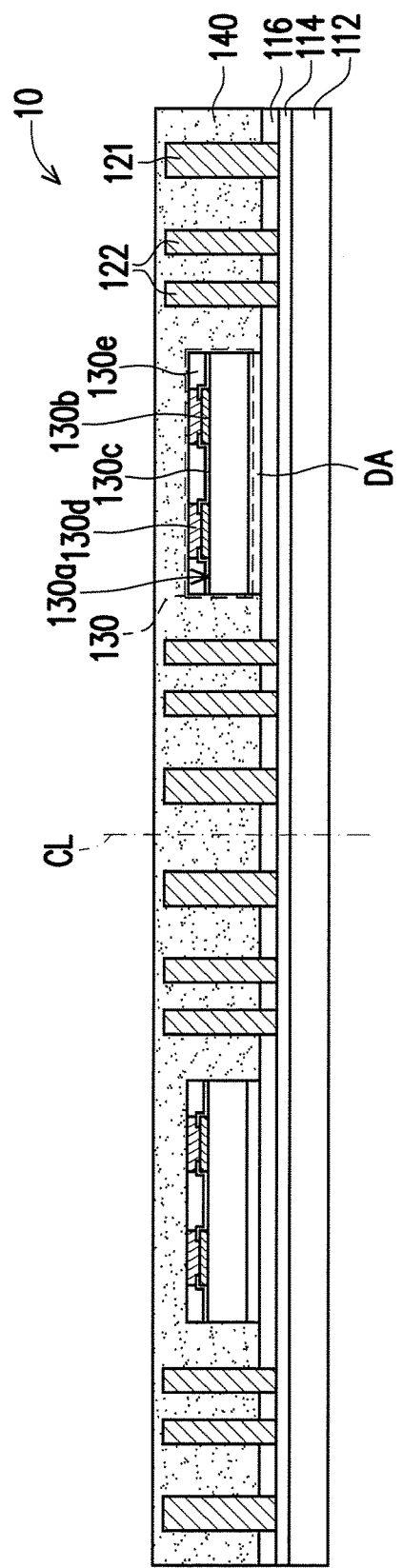

Referring to FIG. 4, in some embodiments, the first die 130, the first TIVs 121 and the second TIVs 122 are molded in the molding compound 140. In some embodiments, the molding compound 140 at least fills the gaps between the first die 130, the first TIVs 121 and the second TIVs 122, and covers the patterned dielectric layer 116. In some embodiments, the molding compound 140 is formed over the first die 130, the first TIVs 121 and the second TIVs 122, and covers the conductive pillars 130d and the protection layer 130e of the first die 130, the first TIVs 121 and the second TIVs 122.

Figure 5:
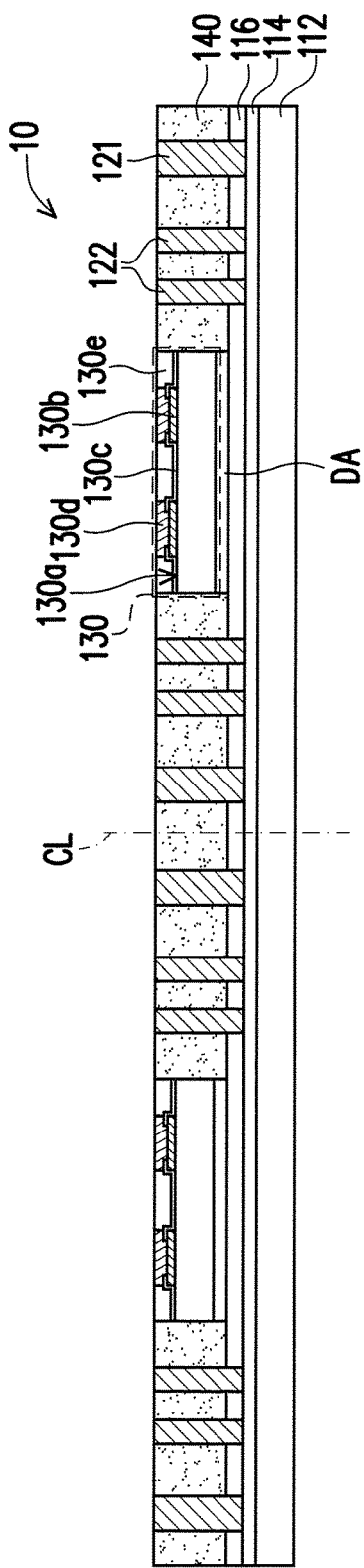

Referring to FIG. 5, in some embodiments, the molding compound 140, the first TIVs 121 and the second TIVs 122 are planarized until the first TIVs 121, the second TIVs 122 and the top surfaces of the conductive pillars 130d and the protection layer 130e of the first die 130 are exposed. In certain embodiments, as shown in FIG. 5, after the planarization, the conductive pillars 130d and the protection layer 130e of the first die 130 become substantially leveled with the first TIVs 121, the second TIVs 122 and the molding compound 140. In one embodiment, the top surfaces of the first TIVs 121 and the second TIVs 122, the conductive pillars 130d and the protection layer 130e and the molding compound 140 are coplanar. In one embodiment, the material of the molding compound 140 includes epoxy resins, phenolic resins or silicon-containing resins. In some embodiments, the molding compound 140, the first TIVs 121 and the second TIVs 122 are planarized through a grinding process or a chemical mechanical polishing (CMP) process. After the grinding process, a cleaning step may be optionally performed, for example to clean and remove the residue generated from the grinding step. However, the disclosure is not limited thereto, and the planarizing step may be performed through any other suitable method.

Figure 6:
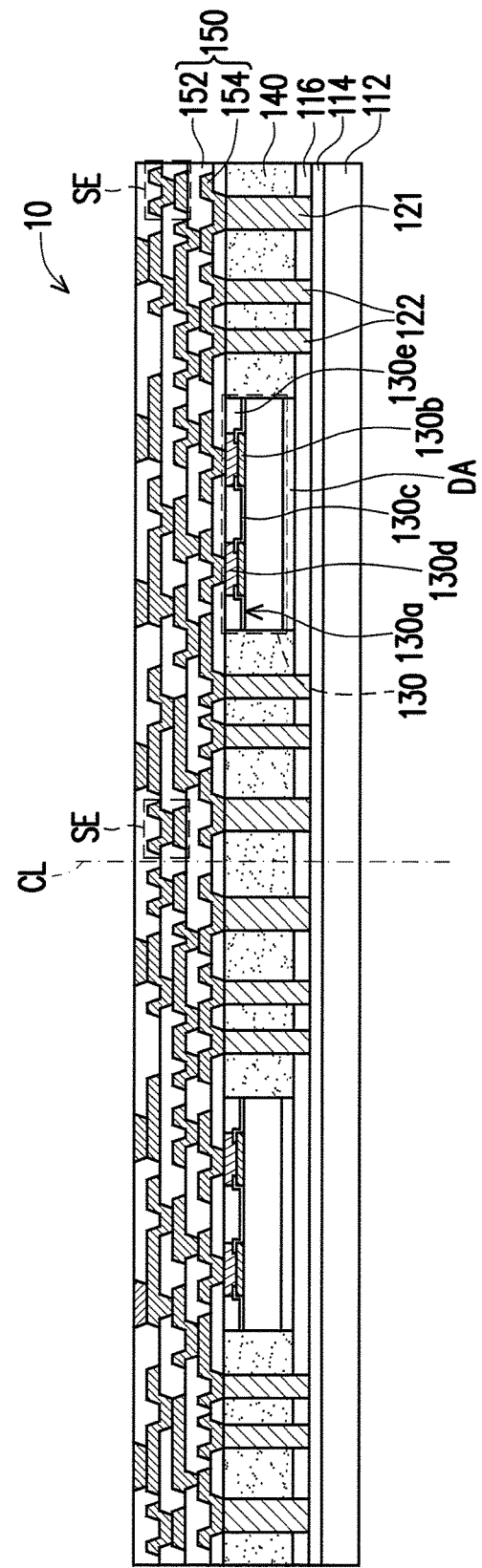

Referring to FIG. 6, in some embodiments, a first redistribution layer 150 is formed on the molding compound 140, the first TIVs 121, the second TIVs 122 and the first die 130. In some embodiments, the first redistribution layer 150 is electrically connected to the first die 130 via the pads 130b and the conductive pillars 130d and is electrically connected to the first TIVs 121 and the second TIVs 122. The formation of the first redistribution layer 150 includes sequentially forming one or more polymer dielectric layers 152 and one or more metallization layers 154 in alternation. In certain embodiments, as shown in FIG. 6, the metallization layers 154 are sandwiched between the polymer dielectric layers 152, but the top surface of the topmost layer of the metallization layers 154 is exposed and the lowest layer of the metallization layers 154 is connected to the first TIVs 121, the second TIVs 122 and the conductive pillars 130d of the first die 130. In some embodiments, the material of the metallization layers 154 includes aluminum, titanium, copper, nickel, tungsten, and/or alloys thereof, and the metallization layers 154 may be formed by electroplating or deposition. In some embodiments, the material of the polymer dielectric layers 152 includes polyimide, epoxy resin, acrylic resin, phenol resin, benzocyclobutene (BCB), polybenzooxazole (PBO), or any other suitable polymer-based dielectric material.

In certain embodiments, as shown in FIG. 6, a portion of the metallization layers 154 of the first redistribution layer 150 located close to but not on the cutting line CL constitutes a sealing element SE. In certain embodiments, the sealing element SE is at least overlapped with the first TIVs 121, and the sealing element SE is electrically isolated with the first die 130, the first TIVs 121, the second TIVs 122 and the rest of the metallization layers 154 of the first redistribution layer 150. Owing to the sealing element, the package structure 10 has better supporting strength.

Figure 7:
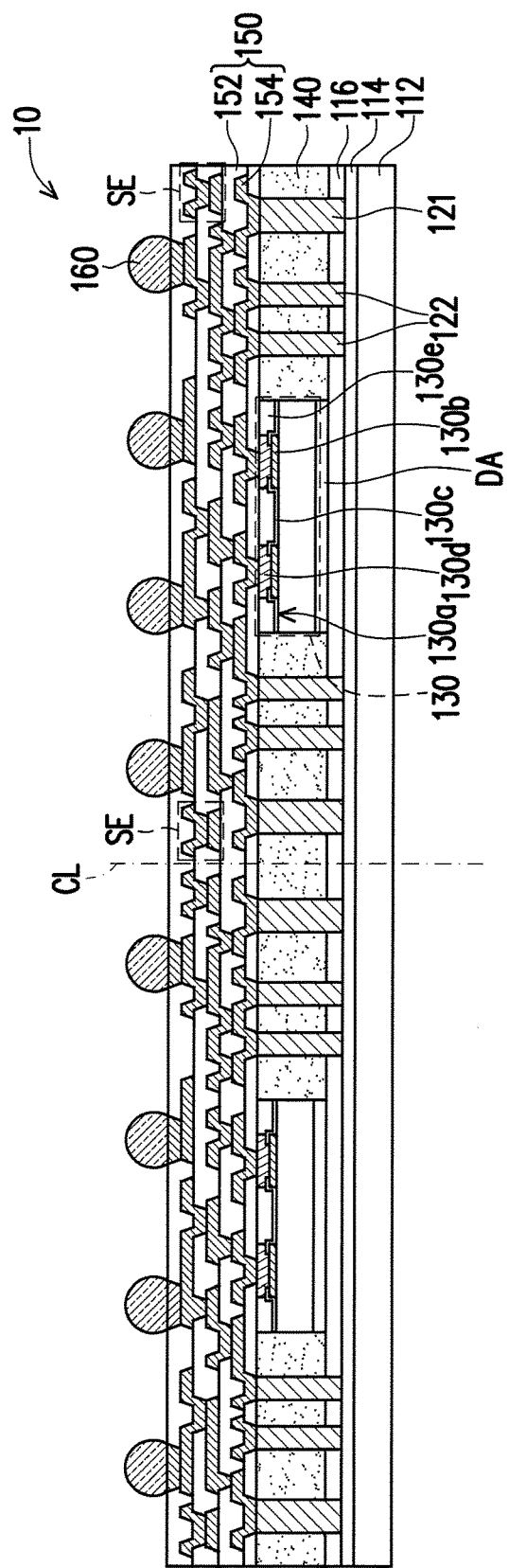

Referring to FIG. 7, conductive elements 160 are disposed on the topmost metallization layer 154 of the first redistribution layer 150. In certain embodiments, the first redistribution layer 150 is located between the molding compound 140 and the conductive elements 160. In some embodiments, prior to disposing the conductive elements 160, solder paste (not shown) or flux is applied so that the conductive elements 160 are better fixed to the topmost metallization layer 154. In some embodiments, the conductive elements 160 are, for example, solder balls or ball grid array (BGA) balls placed on the exposed topmost metallization layer 154 of the first redistribution layer 150 and parts of the topmost metallization layer 154 underlying the conductive elements 160 function as UBM layers. In some embodiments, through the first redistribution layer 150, some of the conductive elements 160 are electrically connected to the first die 130, and some of the conductive elements 160 are electrically connected the first TIVs 121 and/or the second TIVs 122.

Figure 8:
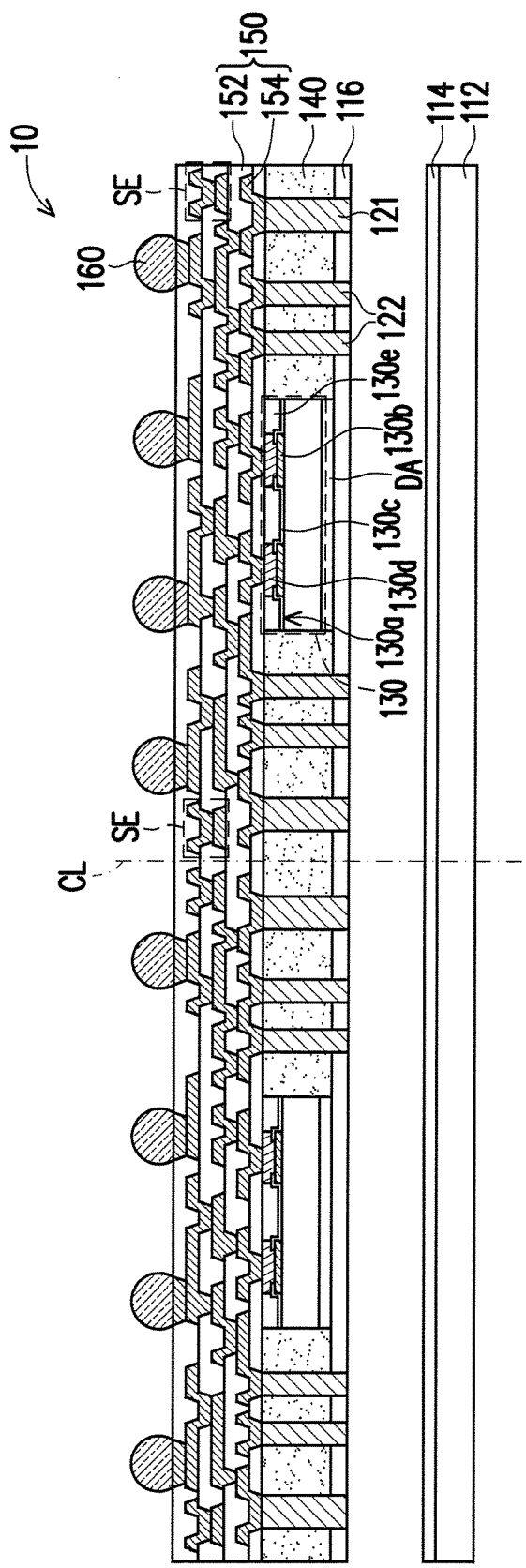

Referring to FIG. 8, in some embodiments, the carrier 112 is debonded from the first die 130, the first TIVs 121 and the second TIVs 122. The package structure 10 is easily separated from the carrier 112 due to the debond layer 114, and bottom surfaces of the first TIVs 121 and the second TIVs 122 are exposed.

Figure 9:
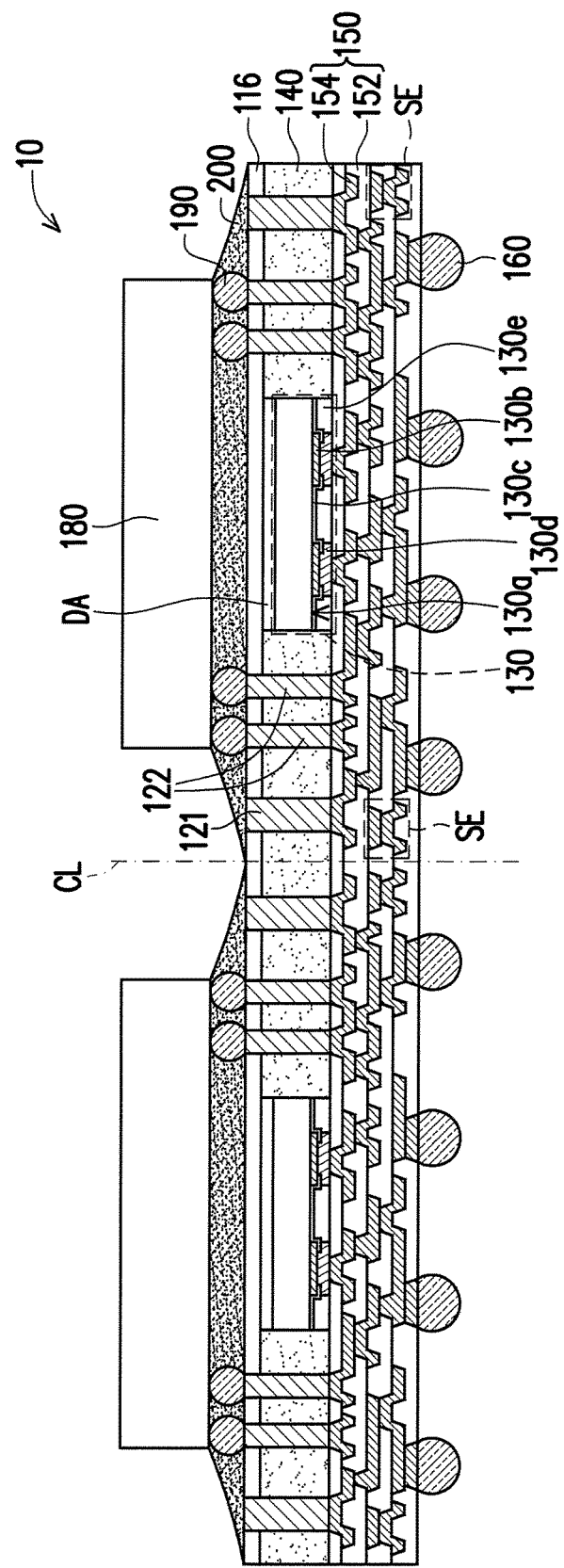

Referring to FIG. 9, in some embodiment, the package structure 10 debonded from the carrier 112 is then flipped (turned upside down) and is disposed with at least one second die 180. In certain embodiments, the second die 180 is disposed on the bottom surfaces of the second TIVs 122 with connectors 190 there-between. In one embodiment, the second die 180 is joined to the second TIVs 122 after the conductive elements 160 is disposed on the first redistribution layer 150 and the carrier 112 is debonded. In some embodiments, the second die 180 is attached to the second TIVs 122 with the connectors 190 through flip chip bonding technology. In certain embodiments, the patterned dielectric layer 116 is located between the first die 130 and the second die 180. In some embodiments, the connectors 190 are, for example, bumps or solder balls. In certain embodiments, a sealing material 200 at least fills the gaps between the second die 180, the connectors 190 and the patterned dielectric layer 116, and covers the patterned dielectric layer 116. In some embodiments, the sealing material 200 is disposed on the molding material 140 and between the second die 180 and the molding compound 140. In one embodiment, the sealing materials 200 may be formed by underfill dispensing or any other suitable method. In some embodiments, materials of the sealing material 200 and the molding compound 140 may be the same or different, the disclosure is not limited thereto.

In some embodiments, the second die 180 may be memory devices jointed to the second TIVs 122 by using the flip chip bonding technology. In some embodiments, the memory devices may include dynamic random access memories (DRAM), but not limited thereto. In some embodiments, the second die 180 may be electrically connected to the first die 130 through the connectors 190, the second TIVs 122, the first redistribution layer 150, the conductive pillars 130*d* and the pads 130*b*. In some embodiments, the second die 180 may be electrically connected to the conductive elements 160 through the connectors 190, the second TIVs 122 and the first redistribution layer 150. In one embodiment, the second die 180 is electrically connected to the first TIVs 121 and/or the second TIVs 122 via the connectors 190 and the first redistribution layer 150.

Figure 10:
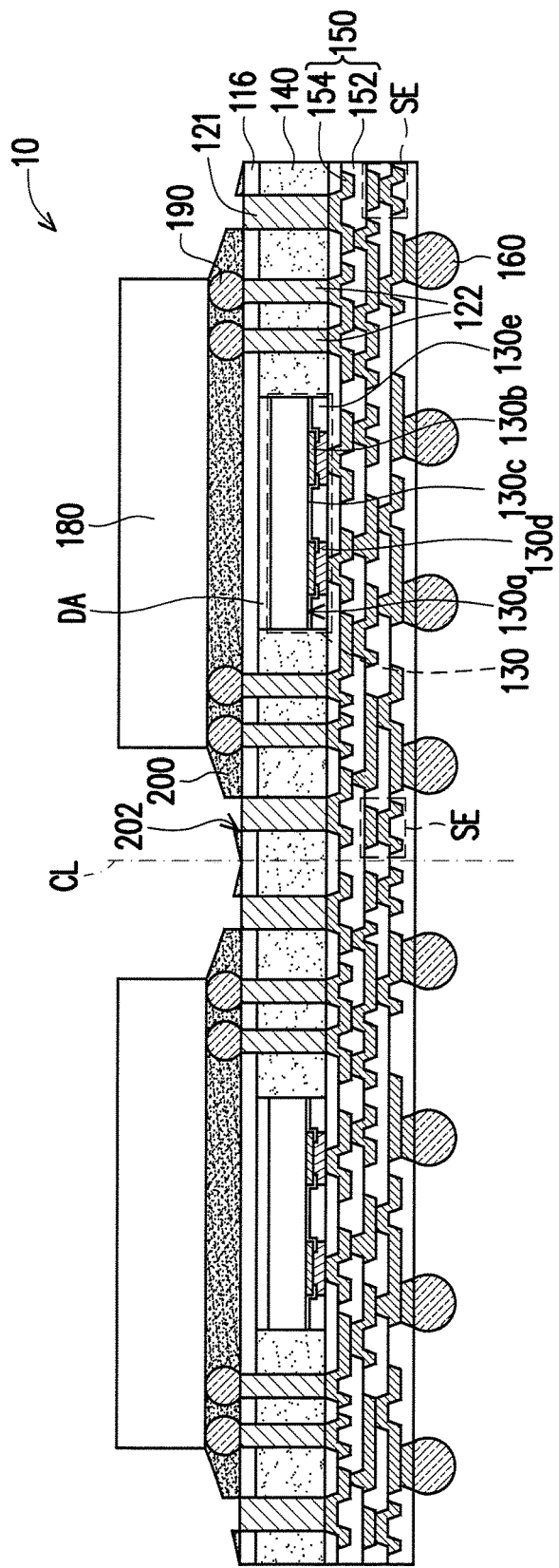

Referring to FIG. 10, in some embodiments, the sealing material 200 is patterned to form contact windows 202. In certain embodiments, the contact windows 202 expose the bottom surface of the first TIVs 121. In one embodiment, the method of patterning the sealing material 200 may be laser drilling or any other suitable method.

Figure 11:
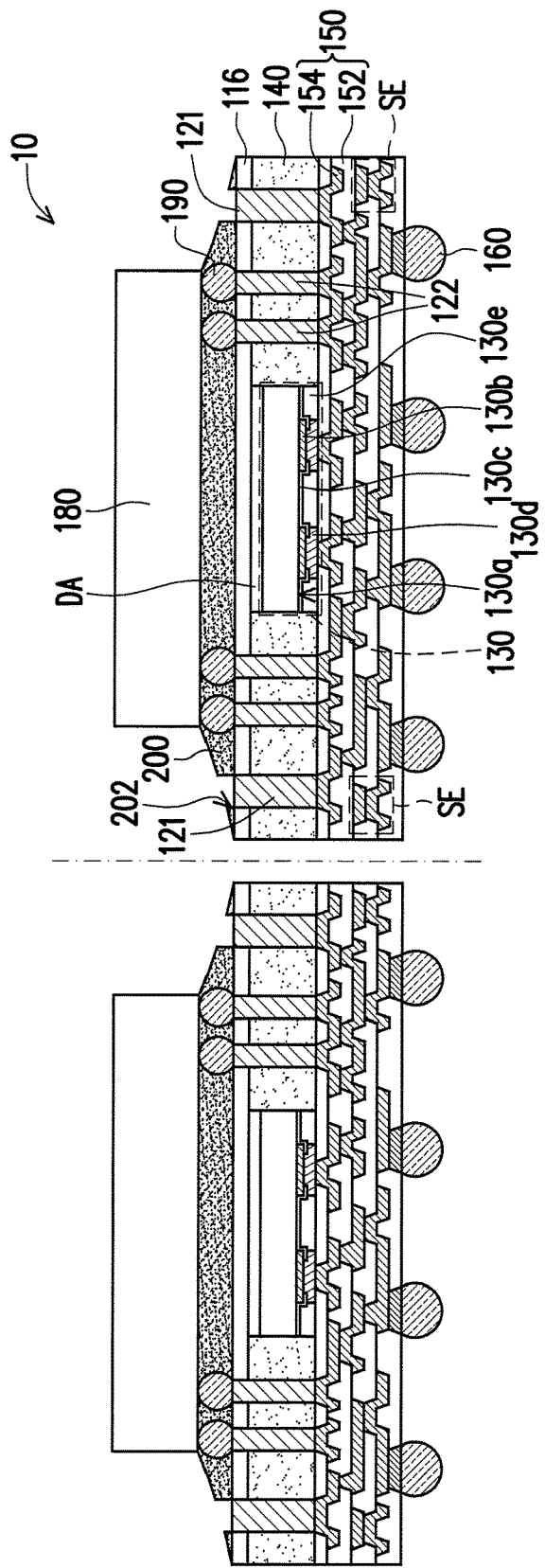

Referring to FIG. 11, in some embodiments, a sigulation (dicing) process is performed to cut the whole package structure (at least cutting though the sealing material 200, the first redistribution layer 150 and the molding compound 140) along the cutting line CL (the dotted line) into individual and separated semiconductor packages 10. In one embodiment, the sigulation (dicing) process is a wafer dicing process including mechanical sawing or laser cutting.

Figure 12:
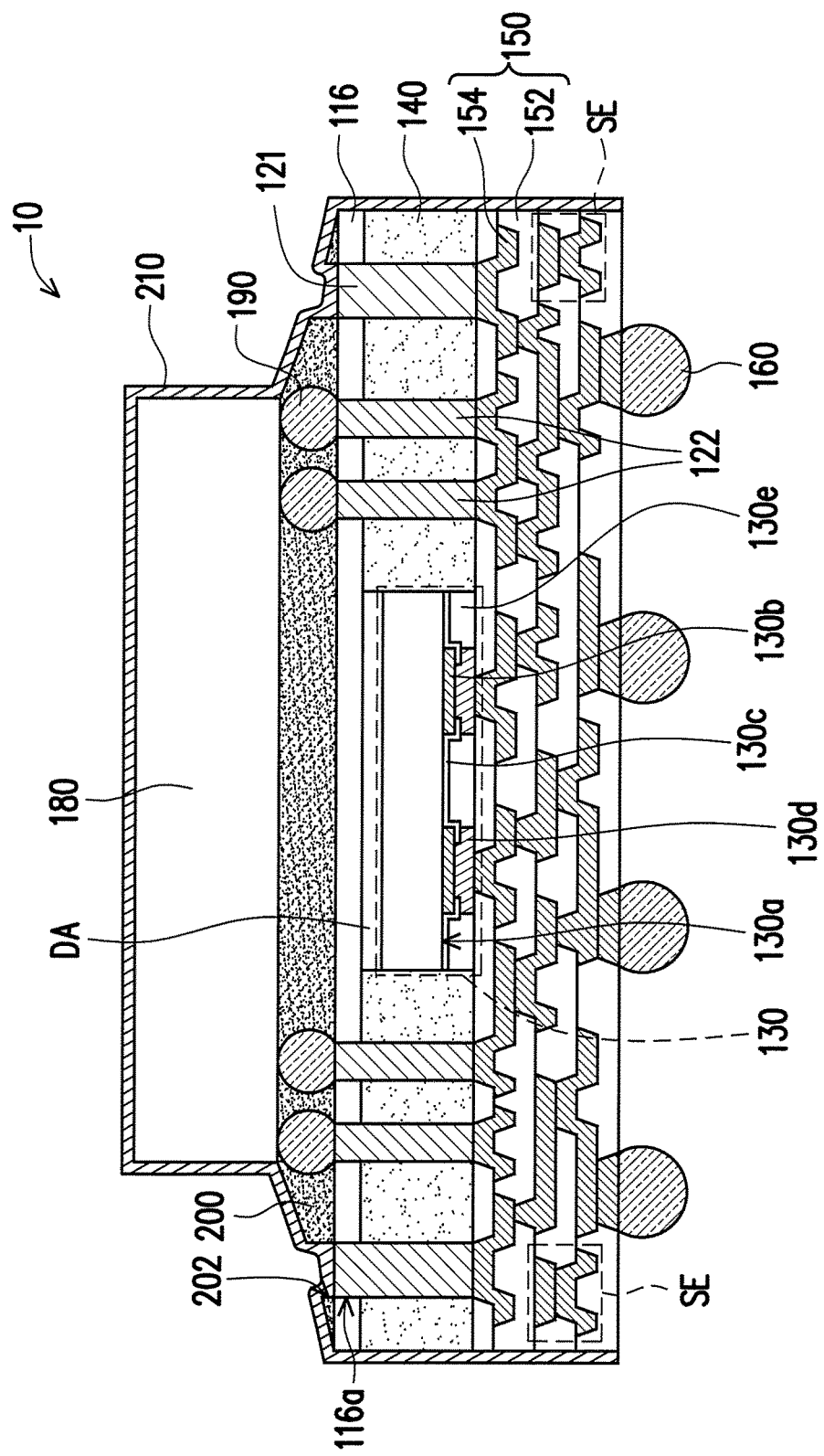

Referring to FIG. 12, in some embodiments, an electromagnetic interference shielding layer 210 is disposed over the second die 180 and electrically connected to the first TIVs 121 so that the semiconductor package 10 is formed. In certain embodiments, the electromagnetic interference shielding layer 210 covers the second die 180, the sealing material 200, the first TIVs 121 and the lateral surfaces of the molding compound 140 and the first redistribution layer 150 in conformal manner, and the electromagnetic interference shielding layer 210 at least covers the first TIVs 121 exposed by the sealing material 200 and at least fills a portion of the contact windows 202. In some embodiment, the electromagnetic interference shielding layer 210 may fully fill the contact windows 202. In some embodiments, the electromagnetic interference shielding layer 210 is in contact with the bottom surface of the first TIVs 121 through the contact windows 202, and the first TIVs 121 may be used as ground vias as the electromagnetic interference shielding layer 210 is electrically grounded through the first TIVs 121, the first redistribution layer 150 and the corresponding conductive elements 160 connecting to a ground plane (not shown). In some embodiments, the electromagnetic interference shielding layer 210 may be made of an electrically conductive material. Materials used for the electromagnetic interference shielding layer 210 may include copper, nickel, an alloy of nickel and iron, an alloy of copper and nickel, silver, etc., but not limited thereto. In some embodiments, the electromagnetic interference shielding layer 210 may be fabricated by using an electrolytic plating, electroless plating, sputtering, physical vapor deposition ("PVD"), chemical vapor deposition ("CVD"), or other suitable metal deposition process. The electromagnetic interference shielding layer 210 is used for reducing or inhibiting the electromagnetic field in a space by blocking the field with barriers made of conductive or magnetic materials. The electromagnetic interference shielding layer 210 in some embodiments may reduce the coupling of, for example, radio waves, electromagnetic fields and electrostatic fields.

Referring to FIG. 2, in some embodiments, the package structure 10 includes the first TIVs 121, the second TIVs 122, the first die 130, the molding compound 140, the first redistribution layer 150, the conductive elements 160, the second die 180, the electromagnetic interference shielding layer 210. In some embodiments, the first TIVs 121, the second TIVs 122 and the first die 130 are disposed on the patterned dielectric layer 116 and are molded in the molding compound 140, wherein the second TIVs 122 are located between the first die 130 and the first TIVs 121. In some embodiments, the molding compound 140 covers the patterned dielectric layer 116 and fills the gaps between the first TIVs 121, the second TIVs 122 and the first die 130. In certain embodiments, the second die 180 is disposed on the molding compound 140, and is attached to the second TIVs 122 with the connectors 190 through flip chip bonding technology. In certain embodiments, the connectors 190 is in contact with the second die 180 and the second TIVs 122. In certain embodiments, the patterned dielectric layer 116 is located between the first die 130 and the second die 180 and has a plurality of opening 116*a*, wherein a portion of the first TIVs 121 and a portion of the second TIVs 122 are respectively located in one of the openings 116*a*. In certain embodiments, the sealing material 200 is disposed between the second die 180 and the molding compound 140 and covers the patterned dielectric layer 116, wherein the sealing materials 200 at least fills the gaps between the second die 180, the connectors 190 and the patterned dielectric layer 116, and has contact windows 202 exposing the first TIVs 121. In some embodiments, the electromagnetic interference shielding layer 210 covers the second die 180, the sealing material 200 and the lateral surfaces of the molding compound 140 and the first redistribution layer 150 in a conformal manner. Owing to the contact windows 202, the electromagnetic interference shielding layer 210 is electrically connected to the first TIVs 121 by directly contacting the first TIVs 121. In some embodiments, the second die 180 is stacked over the first die 130 and located between the molding compound 140 and the electromagnetic interference shielding layer 210.

In some embodiments, the first redistribution layer 150 is disposed on the molding compound 140. In certain embodiments, the first redistribution layer 150 is electrically connected to the first die 130 through the conductive pillars 130*d* and the pads 130*b* of the first die 130, and is electrically connected to the first TIVs 121 and the second TIVs 122. In some embodiments, the conductive elements 160 are connected to the first redistribution layer 150, wherein the first redistribution layer 150 is located between the conductive elements 160 and the molding compound 140. In certain embodiments, some of the conductive elements 160 are electrically connected to the first die 130 through the first redistribution layer 150, the conductive pillars 130d and the pads 130b. In certain embodiments, some of the conductive elements 160 are electrically connected to the first TIVs 121 and/or the second TIVs 122 through the first redistribution layer 150. In certain embodiments, some of the conductive elements 160 are electrically connected to the second die 180 through the first redistribution layer 150, the second TIVs 122 and the connectors 190. In certain embodiments, the connectors 190 is in contact with the second die 180 and the second TIVs 122. In some embodiments, the first TIVs 121 may be considered as ground vias as the electromagnetic interference shielding layer 210 is electrically grounded through the first TIVs 121, the first redistribution layer 150, and the corresponding conductive elements 160 connecting to a ground plane (not shown). The electromagnetic interference shielding layer 210 is used for reducing or inhibiting the electromagnetic field in a space by blocking the field with barriers made of conductive or magnetic materials. The electromagnetic interference shielding layer 210 in some embodiments may reduce the coupling of, for example, radio waves, electromagnetic fields and electrostatic fields.

In certain embodiments, the sealing element SE is located in the first redistribution layer 150 close to an edge region of the semiconductor package 10, and is at least overlapped with the first TIVs 121. The sealing element SE is electrically isolated with the first die 130, the first TIVs 121, the second TIVs 122, the first redistribution layer 150, and the electromagnetic interference shielding layer 210. Owing to the sealing element, the package structure 10 has better supporting strength. In certain embodiments, the first die 130 is a 2.4 GHz radio frequency chip, a 5 GHz radio frequency chip, or a combined 2.4 GHz/5 GHz radio frequency chip, and the second die 180 is a DRAM, but not limited thereto.

Figure 13:
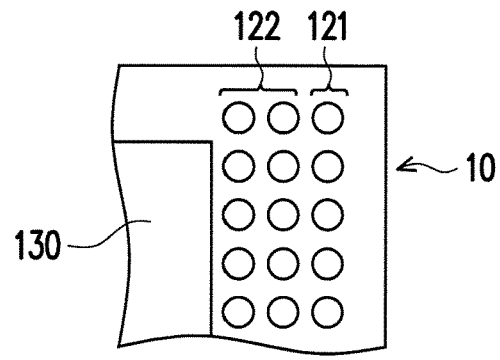
FIG. 13 to FIG. 17 are enlarged schematic partial top views illustrating different positions of the first through interlayer vias of a package structure according to some exemplary embodiments of the present disclosure.
Figure 14:
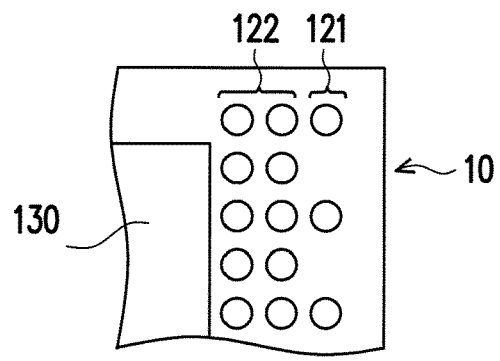
Figure 15:
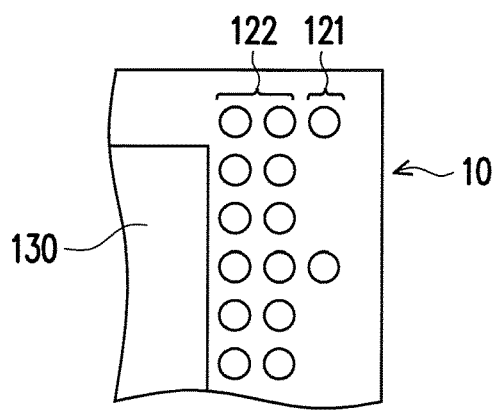
Figure 16:
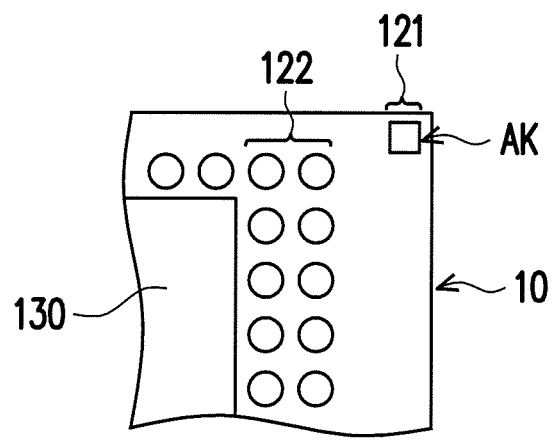
Figure 17:
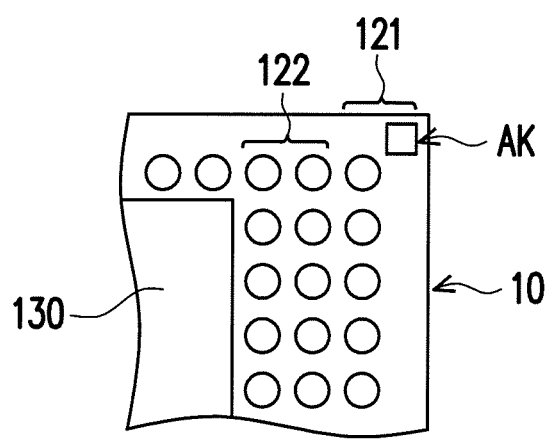

FIG. 13 to FIG. 17 are enlarged schematic partial top views illustrating different positions of the first through interlayer vias (TIVs) of a package structure according to some exemplary embodiments of the present disclosure. The position of the first TIVs is various and can be modified in demand. In some embodiments, the second TIVs 122 are located between the first die 130 and the first TIVs 121. For exemplary examples, the first TIVs 121 and the second TIVs 122 of the semiconductor package 10 are arranged in a form of matrix, wherein each row has one first TIV 121 and two second TIVs 122 (as shown in FIG. 13); a first row and a second row are alternatively arranged in a column direction, in which the first row has one first TIV 121 and two second TIVs 122 and the second row has only two second TIVs 122 (as shown in FIG. 14); the repeating units of first row-second row-second row are arranged in a column direction, in which the first row has one first TIV 121 and two second TIVs 122 and the second row has only two second TIVs 122 (as shown in FIG. 15). In some embodiments, there may only be one first TIV 121 formed in a position of the alignment mark AK originated in a wafer (as shown in FIG. 16). In some embodiments, in addition to being formed in the position of the alignment mark AK, the first TIVs 121 may be arranged in a form of a matrix with the second TIVs 122 (as shown in FIG. 17). Owing to the positioning configuration of the first TIVs 121, no extra space of the semiconductor package 10 is required for the formation of the first TIVs 121, thereby ensuring the small form factor and reducing the manufacturing cost.

According to some embodiments, a package structure has at least one first die, at least one second die, a molding compound, a first redistribution layer, at least one first through interlayer via, second through interlayer vias, an electromagnetic interference shielding layer and conductive elements. The at least one first die is molded in a molding compound. The at least one second die is disposed on the molding compound. The first redistribution layer is disposed on the molding compound and electrically connected to the first die and the second die, wherein the molding compound is located between the second die and the first redistribution layer. The at least one first through interlayer via is molded in the molding compound and electrically connected to the first redistribution layer. The second through interlayer vias are molded in the molding compound and electrically connected to the first redistribution layer, wherein the second through interlayer vias are located between the first die and the first through interlayer via. The electromagnetic interference shielding layer is disposed over the second die and electrically connected to the first through interlayer via. The conductive elements are connected to the first redistribution layer, wherein the first redistribution layer is located between the conductive elements and the molding compound.

According to some embodiments, a package structure has a first die, a molding compound, a first redistribution layer, at least one through via, a second die, a sealing material, an electromagnetic interference shielding layer and conductive elements. The first die is molded in a molding compound. The first redistribution layer is disposed on the molding compound and electrically connected to the first die. The at least one through via is molded in the molding compound and electrically connected to the first redistribution layer. The second die is disposed on the molding compound and electrically connected to the first redistribution layer, wherein the molding compound is located between the second die and the first redistribution layer. The sealing material is disposed on the molding compound and is located between the second die and the molding compound, wherein the sealing material has at least one contact window exposing the through via. The electromagnetic interference shielding layer is disposed over the second die, wherein the electromagnetic interference shielding layer is in contact with the through via through the contact window. The conductive elements are connected to the first redistribution layer, wherein the first redistribution layer is located between the conductive elements and the molding compound.

According to some embodiments, a manufacturing method of a package structure is provided. A first die is disposed on a carrier. At least one first through interlayer via is formed on the carrier. The first die and the first through interlayer via are encapsulated in a molding compound. A first redistribution layer is formed on the molding compound, wherein the first redistribution layer is electrically connected to the first die and the first through interlayer via. Conductive elements are disposed on the first redistribution layer, wherein the first redistribution layer is located between the molding compound and the conductive elements. The carrier is debonded from the first die and the first through interlayer via. A second die is disposed on the molding compound, wherein the second die is electrically connected to the first redistribution layer, and the molding compound is located between the second die and the first redistribution layer. A sealing material is disposed between the second die and the molding compound. At least one contact window exposing the first through interlayer via is formed by performing a laser drilling on the sealing material. An electromagnetic interference shielding layer is formed over the second die, wherein the electromagnetic interference shielding layer is in contact with the first through interlayer via through the contact window.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   at least one first die, molded in a molding compound;
   at least one second die, disposed on the molding compound;
   a first redistribution layer, disposed on the molding compound and electrically connected to the first die and the second die, wherein the molding compound is located between the second die and the first redistribution layer;
   at least one first through interlayer via, molded in the molding compound and electrically connected to the first redistribution layer, wherein a sidewall of a portion of the first through interlayer via physically contacts the molding compound, and the portion of the first through interlayer via is overlapped with the first die in a direction perpendicular to a stacking direction of the first die and the first redistribution layer;
   second through interlayer vias, molded in the molding compound and electrically connected to the first redistribution layer, wherein each of the second through interlayer vias is located between the first die and the first through interlayer via and penetrates through the molding compound;
   an electromagnetic interference shielding layer, disposed over the second die and in physical contact with the first through interlayer via; and
   conductive elements, connected to the first redistribution layer, wherein the first redistribution layer is located between the conductive elements and the molding compound.

2. The package structure as claimed in claim 1, further comprising a sealing material disposed between the second die and the molding compound, wherein the electromagnetic interference shielding layer penetrating through the sealing material to be in contact with the first through interlayer via.

3. The package structure as claimed in claim 2, wherein the electromagnetic interference shielding layer is in contact with the sealing material, the molding compound and the first redistribution layer, and sidewalls of the first redistribution layer are covered by the electromagnetic interference shielding layer.

4. The package structure as claimed in claim 1, further comprising connectors being in contact with the second through interlayer vias and the second die, wherein the second die is electrically connected to the first redistribution through the connectors and the second through interlayer vias.

5. The package structure as claimed in claim 1, wherein the first die comprises conductive pillars, and the first die is electrically connected to the first redistribution layer through the conductive pillars.

6. The package structure as claimed in claim 1, further comprising a sealing element disposed in the first redistribution layer, wherein the sealing element is at least partially overlapped with the first through interlayer via.

7. The package structure as claimed in claim 1, further comprising a patterned dielectric layer located between the first die and the second die and having a plurality of openings, wherein the first die is disposed on the patterned dielectric layer through a die attached film, and a portion of the first through interlayer via is correspondingly located in one of the opening.

8. The package structure as claimed in claim 1, wherein the second die is stacked over the first die and located between the electromagnetic interference shielding layer and the molding compound.

9. A package structure, comprising:
   a first die, molded in a molding compound;
   a first redistribution layer, disposed on the molding compound and electrically connected to the first die;
   at least one through via, molded in the molding compound and electrically connected to the first redistribution layer;
   a second die, disposed on the molding compound and electrically connected to the first redistribution layer, wherein the molding compound is located between the second die and the first redistribution layer;
   a sealing material disposed on the molding compound and located between the second die and the molding compound, wherein the sealing material has at least one contact window exposing the through via;
   an electromagnetic interference shielding layer, disposed over the second die, wherein the electromagnetic interference shielding layer is in contact with the through via through the contact window; and
   conductive elements, connected to the first redistribution layer, wherein the first redistribution layer is located between the conductive elements and the molding compound.

10. The package structure as claimed in claim 9, further comprising through interlayer vias molded in the molding compound and electrically connected to the first redistribution layer, wherein the through interlayer vias are located between the first die and the through via.

11. The package structure as claimed in claim 10, further comprising connectors being in contact with the through interlayer vias and the second die, wherein the second die is electrically connected to the first redistribution layer through the connectors and the through interlayer vias.

12. The package structure as claimed in claim 9, wherein the first die comprises conductive pillars, and the first die is electrically connected to the first redistribution layer through the conductive pillars.

13. The package structure as claimed in claim 9, further comprising a sealing element disposed in the first redistribution layer, wherein the sealing element is at least partially overlapped with the through via.

14. The package structure as claimed in claim 9, further comprising a patterned dielectric layer located between the first die and the second die and having a plurality of openings, wherein the first die is disposed on the patterned dielectric layer, and a portion of the through via is correspondingly located in one of the opening.

15. A method of manufacturing a package structure, comprising:
- disposing a first die on a carrier;
- forming at least one first through interlayer via on the carrier;
- encapsulating the first die and the first through interlayer via in a molding compound;
- forming a first redistribution layer on the molding compound, wherein the first redistribution layer is electrically connected to the first die and the first through interlayer via;
- disposing conductive elements on the first redistribution layer, wherein the first redistribution layer is located between the molding compound and the conductive elements;
- debonding the carrier from the first die and the first through interlayer via;
- disposing a second die on the molding compound, wherein the second die is electrically connected to the first redistribution layer, and the molding compound is located between the second die and the first redistribution layer;
- disposing a sealing material between the second die and the molding compound;
- forming at least one contact window exposing the first through interlayer via by performing a laser drilling on the sealing material; and
- forming an electromagnetic interference shielding layer over the second die, wherein the electromagnetic interference shielding layer is in contact with the first through interlayer via through the contact window.

16. The method as claimed in claim 15, further comprising forming second through interlayer vias on the carrier, wherein the second through interlayer vias are encapsulated inside the molding compound and located between the first die and the first through interlayer via, and the second through interlayer vias are electrically connected to the first redistribution layer.

17. The method as claimed in claim 16, wherein the first through interlayer via and the second through interlayer vias are simultaneously formed.

18. The method as claimed in claim 16, wherein disposing the second die further comprises disposing connectors to directly contact the second through interlayer vias and the second die, wherein the second die is electrically connected to the first redistribution layer through the connectors and the second through interlayer vias.

19. The method as claimed in claim 18, wherein the second die is connected to the second through interlayer vias through flip chip bonding technology.

20. The method as claimed in claim 15, wherein the electromagnetic interference shielding layer is formed in a conformal manner.

* * * * *